US010095342B2

(12) United States Patent
Kwong et al.

(10) Patent No.: US 10,095,342 B2
(45) Date of Patent: Oct. 9, 2018

(54) APPARATUS FOR SENSING USER INPUT

(71) Applicant: Google LLC, Mountain View, CA (US)

(72) Inventors: Kelvin Kwong, San Jose, CA (US);
Debanjan Mukherjee, San Jose, CA (US);
James Aaron Cooper, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 125 days.

(21) Appl. No.: 15/351,397

(22) Filed: Nov. 14, 2016

(65) Prior Publication Data
US 2018/0136770 A1 May 17, 2018

(51) Int. Cl.
G06F 3/041 (2006.01)
G01L 1/22 (2006.01)
G06F 3/045 (2006.01)
G06F 1/16 (2006.01)

(52) U.S. Cl.
CPC ............ *G06F 3/0414* (2013.01); *G01L 1/225* (2013.01); *G06F 3/045* (2013.01); *G06F 1/1601* (2013.01); *G06F 2200/1636* (2013.01)

(58) Field of Classification Search
CPC ...... G06F 3/0414; G06F 3/045; G06F 1/1601; G06F 2200/1636; G01L 1/225
See application file for complete search history.

(56) References Cited

U.S. PATENT DOCUMENTS

| 5,648,757 | A  | 7/1997  | Vernace et al. |
| 6,392,584 | B1 | 5/2002  | Eklund |
| 6,414,619 | B1 | 7/2002  | Swanson |
| 6,526,801 | B2 | 3/2003  | Kouznestsov |
| 6,747,573 | B1 | 6/2004  | Gerlack |
| 6,823,200 | B2 | 11/2004 | Rekimoto |

(Continued)

FOREIGN PATENT DOCUMENTS

| EP | 2175344 | 4/2010 |
| EP | 2175625 | 4/2010 |

(Continued)

OTHER PUBLICATIONS

International Search Report and Written Opinion issued in International Application No. PCT/US2017/064916, dated Apr. 30, 2018, 21 pages.

(Continued)

*Primary Examiner* — Abhishek Sarma
(74) *Attorney, Agent, or Firm* — Fish & Richardson P.C.

(57) ABSTRACT

An apparatus for sensing user input includes a first strain gauge grouping attached to an inner surface of a housing of a device, and a second strain gauge grouping attached to the inner surface of the housing. The apparatus includes a circuit coupled to the first and second strain gauge groupings, the circuit being configured to: (i) receive a first parameter signal from the first strain gauge grouping in response to user input that interacts with the housing over a location of the first strain gauge grouping, (ii) indicate that a first type of user input has been received in response to receipt of the first parameter signal, (iii) receive a second parameter signal from the second strain gauge grouping in response to user input that interacts with the housing over a location of the second strain gauge grouping, and (iv) indicate that a second type of user input has been received in response to receipt of the second parameter signal.

20 Claims, 4 Drawing Sheets

(56) References Cited

U.S. PATENT DOCUMENTS

| | | |
|---|---|---|
| 7,546,772 B2 | 6/2009 | Cabuz et al. |
| 7,974,500 B2 | 6/2011 | Silverbrook et al. |
| 8,078,884 B2 | 12/2011 | Ramatishnan |
| 8,417,303 B2 | 4/2013 | Ladouceur |
| 8,442,602 B2 | 5/2013 | Wong |
| 8,536,765 B2 | 9/2013 | Oh et al. |
| 8,539,765 B2 | 9/2013 | Oh et al. |
| 8,559,086 B2 | 10/2013 | Davis et al. |
| 9,304,948 B2 | 4/2016 | Whitman et al. |
| 9,411,451 B2 | 8/2016 | Myers et al. |
| 9,460,029 B2 | 10/2016 | Shaw et al. |
| 9,465,412 B2 | 10/2016 | Belesiu et al. |
| 2003/0026971 A1 | 2/2003 | Inkster et al. |
| 2003/0210235 A1 | 11/2003 | Roberts |
| 2004/0125079 A1 | 7/2004 | Kaneko et al. |
| 2004/0203500 A1 | 10/2004 | Wong et al. |
| 2004/0203503 A1 | 10/2004 | Rollins |
| 2006/0028459 A1 | 2/2006 | Underwood et al. |
| 2006/0293864 A1 | 12/2006 | Soss |
| 2008/0053713 A1 | 3/2008 | Huang et al. |
| 2008/0166966 A1 | 7/2008 | Hamasak |
| 2009/0259969 A1 | 10/2009 | Pallakoff |
| 2009/0312051 A1 | 12/2009 | Hamasak |
| 2009/0315745 A1 | 12/2009 | McLoughlin |
| 2010/0015918 A1 | 1/2010 | Liu |
| 2010/0085724 A1 | 4/2010 | Park |
| 2010/0113111 A1 | 5/2010 | Wong |
| 2010/0123686 A1 | 5/2010 | Klinghult et al. |
| 2010/0201635 A1 | 8/2010 | Klinghult et al. |
| 2011/0069024 A1 | 3/2011 | Kim |
| 2011/0080367 A1 | 4/2011 | Marchand et al. |
| 2011/0227726 A1 | 9/2011 | Lee |
| 2012/0098530 A1 | 4/2012 | Saito et al. |
| 2013/0002565 A1 | 1/2013 | Tumanov et al. |
| 2013/0009905 A1 | 1/2013 | Castillo et al. |
| 2013/0076646 A1 | 3/2013 | Krah et al. |
| 2013/0135223 A1 | 5/2013 | Shai |
| 2013/0154998 A1 | 6/2013 | Yang et al. |
| 2013/0160567 A1 | 6/2013 | Ota |
| 2013/0176265 A1 | 7/2013 | Zurek |
| 2013/0211740 A1 | 8/2013 | Ramamurthy et al. |
| 2013/0283378 A1 | 10/2013 | Costigan et al. |
| 2013/0300668 A1 | 11/2013 | Churikov et al. |
| 2014/0000386 A1 | 1/2014 | Malhan et al. |
| 2014/0008999 A1 | 1/2014 | Prest et al. |
| 2014/0042873 A1 | 2/2014 | Shen |
| 2014/0073378 A1 | 3/2014 | Coverstone |
| 2014/0200054 A1 | 7/2014 | Fraden |
| 2014/0217853 A1 | 8/2014 | Mankowski |
| 2015/0069126 A1 | 3/2015 | Leon |
| 2015/0119114 A1 | 4/2015 | Smith |
| 2015/0207436 A1 | 7/2015 | Lee |
| 2015/0257158 A1 | 9/2015 | Jadhav |
| 2015/0296622 A1 | 10/2015 | Jiang et al. |
| 2015/0317076 A1 | 11/2015 | Goel et al. |
| 2015/0331522 A1 | 11/2015 | McMillen |
| 2016/0084674 A1 | 3/2016 | Cambou et al. |
| 2016/0191103 A1 | 6/2016 | Balaji |
| 2016/0216164 A1 | 7/2016 | Teil |
| 2017/0031495 A1 | 2/2017 | Smith |
| 2017/0038905 A1 | 2/2017 | Bijamov et al. |

FOREIGN PATENT DOCUMENTS

| | | |
|---|---|---|
| EP | 2672368 | 12/2013 |
| EP | 2784521 | 1/2014 |
| EP | 2784630 | 10/2014 |
| EP | 2801889 | 11/2014 |
| GB | 1391830 | 4/1975 |
| WO | 2006/035342 | 4/2006 |
| WO | 2010/058301 | 5/2010 |
| WO | WO 2015/047616 | 4/2015 |
| WO | 2015/130040 | 9/2015 |
| WO | WO 2015/179262 | 11/2015 |
| WO | WO 2016/027113 | 2/2016 |
| WO | WO 2016/154762 | 10/2016 |
| WO | WO 2017/011810 | 1/2017 |

OTHER PUBLICATIONS

International Search Report and Written Opinion issued in International Application No. PCT/US2017/047065, dated Nov. 10, 2017, 13 pages.

Invitation to Pay Additional Fees and, Where Applicable, Protest Fees issued in International Application No. PCT/US2017/065304, dated Feb. 27, 2018, 26 pages.

Invitation to Pay Additional Fees and, Where Applicable, Protest Fees issued in International Application No. PCT/US2017/064916, dated Mar. 5, 2018, 15 pages.

International Search Report and Written Opinion issued in International Application No. PCT/US2017/065307, dated Mar. 7, 2018, 14 pages.

International Search Report and Written Opinion issued in International Application No. PCT/US2017/057904, dated Jan. 19, 2018, 16 pages.

Written Opinion issued in International Application No. PCT/US2017/047065, dated May 24, 2018, 6 pages.

APPARATUS FOR SENSING USER INPUT

FIELD

The present specification is related to sensing user input to a device.

BACKGROUND

Consumer electronic devices sometimes include buttons that protrude from an outer or exterior surface of a housing of the electronic device. In general, the buttons are used as physical inputs to cause changes to device functions, such as volume control, display activation/deactivation, switching to/from vibrate mode, etc. The buttons are typically positioned on the sides of electronic devices such as smartphones, mobile cellular devices, tablet computers, notebook computers, desktop computer, Google Chromecast devices, Google home. Current design practices relative to electronic devices include reducing the quantity of buttons that protrude from the exterior surfaces of the device housing.

SUMMARY

An apparatus for sensing user input to an electronic device is described. The apparatus utilizes multiple strain gauge (SG) sensing units which are each disposed adjacent an inner surface of the device housing. The SG sensing units sense a particular type of user input to the device based on at least one of: the magnitude of applied strain, the relative location of the applied strain, and the duration of the applied strain. The sensing units can be arranged in particular configurations to sense applied strain along, for example, a lengthwise dimension of the device and/or a widthwise dimension of the device. Hence, the described sensing apparatus provides an approach for receiving user input to an electronic device while also replacing physical buttons that protrude above an exterior surface of the device.

In one innovative aspect of the specification, an apparatus for sensing user input provided on an exterior surface of an electronic device is described. The apparatus includes a first strain gauge grouping attached to an inner surface of a housing of the electronic device and a second strain gauge grouping attached to the inner surface of the housing of the electronic device. The apparatus further includes an electronic circuit electrically coupled to the first strain gauge grouping and the second strain gauge grouping, the electronic circuit configured to: (i) receive a first parameter signal from the first strain gauge grouping in response to user input that interacts with the housing over a location of the first strain gauge grouping, (ii) indicate that a first type of user input has been received in response to receipt of the first parameter signal, (iii) receive a second parameter signal from the second strain gauge grouping in response to user input that interacts with the housing over a location of the second strain gauge grouping, and (iv) indicate that a second type of user input has been received in response to receipt of the second parameter signal.

In some implementations, the first strain gauge grouping includes: a first strain gauge set of multiple strain gauges that indicates a first voltage value when voltage is applied to the first strain gauge set of multiple strain gauges; a second strain gauge set of multiple strain gauges that indicates a second voltage value when voltage is applied to the second strain gauge set of multiple strain gauges; and wherein the first voltage value and the second voltage value are indicated concurrently in response to the user input that interacts with the housing over the location of the first strain gauge grouping. In some implementations, the electronic circuit determines a differential voltage value in response to receiving the first parameter signal corresponding to the first type of user input, the differential voltage value corresponding to a difference between the first voltage value of the first strain gauge set and the second voltage value of the second strain gauge set.

In some implementations, the second strain gauge grouping includes: a first strain gauge set of multiple strain gauges that indicates a first voltage value when voltage is applied to the first strain gauge set of multiple strain gauges; a second strain gauge set of multiple strain gauges that indicates a second voltage value when voltage is applied to the second strain gauge set of multiple strain gauges; and wherein the first voltage value and the second voltage value are indicated concurrently in response to the user input that interacts with the housing over the location of the second strain gauge grouping. In some implementations, the electronic circuit determines a differential voltage value in response to receiving the second parameter signal corresponding to the second type of user input, the differential voltage value corresponding to a difference between the first voltage value of the first strain gauge set and the second voltage value of the second strain gauge set. In some implementations, the apparatus further includes a third strain gauge grouping, wherein the first strain gauge grouping, the second strain gauge grouping, and the third strain gauge grouping are attached longitudinally along an inner surface of the housing by way of an adhesive material. In some implementations, the first strain gauge grouping is configured to allow the electronic device to sense user input to the electronic device, the sensed user input being of a plurality of different types.

In some implementations, the first strain gauge grouping interacts with the second strain gauge grouping to allow the electronic device to sense user input corresponding to at least one of: a particular magnitude of physical force applied to the outer surface of the housing; a particular time period associated with physical force applied to the outer surface of the housing; and a particular magnitude of physical force that is applied to the outer surface of the housing for a particular time period.

In some implementations, the first strain gauge grouping cooperates with the electronic circuit to form a resistor bridge that indicates a parameter signal associated with changes in a resistance attribute of the first strain gauge grouping, the changes occurring based on a particular type of user input. In some implementations, the second strain gauge grouping cooperates with the electronic circuit to form a resistor bridge that indicates a parameter signal associated with changes in a resistance attribute of the second strain gauge grouping, the changes occurring based on a particular type of user input.

In some implementations, in response to user input detected by one of the first strain gauge grouping and the second strain gauge grouping, the electronic circuit amplifies a characteristic of the parameter signal indicated by the resistor bridge. In some implementations, the resistor bridge includes: (i) a first strain gauge set of multiple strain gauges that includes a first strain gauge affixed in a first orientation, and (ii) a second strain gauge set of multiple strain gauges that includes a second strain gauge affixed in a second orientation that differs from the first orientation. In some implementations, the first orientation and the second orientation are perpendicular to each other. In some implementations, the parameter signal indicates a differential voltage value, and wherein the resistance attribute changes in response to tension applied concurrently to each of the first strain gauge of the resistor bridge and the second strain gauge of the resistor bridge.

In one innovative aspect of the specification, an apparatus for sensing user input provided on an area of a device is described. The apparatus includes a first strain gauge grouping configured to be attached to a first surface, the first strain gauge grouping including a first strain gauge having a first orientation and a second strain gauge having a second orientation that differs from the first orientation. The apparatus further includes a second strain gauge grouping configured to be attached to the surface, the second strain gauge grouping including a first strain gauge having a first orientation and a second strain gauge having a second orientation that differs from the first orientation. The apparatus further includes a third strain gauge grouping configured to be attached to the surface, the third strain gauge grouping including a first strain gauge having a first orientation and a second strain gauge having a second orientation that differs from the first orientation. Each strain gauge grouping is configured to couple to an electrical conductor, the electrical conductor being configured to provide parameter signals to an electronic circuit that detects user input of a particular type in response to a user interacting with an area of the device.

In some implementations, the first strain gauge grouping interacts with at least the second strain gauge grouping to allow the device to sense user input corresponding to at least one of: a particular magnitude of physical force applied to the surface; a particular time period associated with physical force applied to the surface; and a particular magnitude of physical force that is applied to the surface for a particular time period. In some implementations, the first strain gauge grouping cooperates with the electronic circuit to form a resistor bridge that indicates a parameter signal associated with changes in a resistance attribute of the first strain gauge grouping, the changes occurring based on a particular type of user input. In some implementations, the resistor bridge includes a first strain gauge set that includes a first strain gauge affixed in a first orientation and a second strain gauge set that includes a second strain gauge affixed in a second orientation that differs from the first orientation.

In some implementations, each strain gauge grouping includes: a first strain gauge set configured to indicate a first voltage value; a second strain gauge set configured to indicate a second voltage value; and wherein the first voltage value and the second voltage value are indicated concurrently in response to the user interacting with an area of the device. In some implementations, the first, second, and third strain gauge groupings are each attached to the surface by way of an adhesive material and in a parallel configuration, the surface corresponding to the surface of a plate.

The subject matter described in this specification can be implemented in particular embodiments and can result in one or more of the following advantages. The apparatus of this specification allows device manufacturers to produce electronic devices that have a reduced quantity of buttons protruding from an exterior surface of the device housing. More particularly, reducing the number of buttons can minimize steps required during execution of manufacturing and/or machining operations when producing device housings in substantial volumes. Furthermore, use of the strain gauge sensing units described in this specification can reduce the amount circuit components (wires, capacitors, etc.) and reduce power consumption typically required to enable sensing functions provided by mechanical buttons.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

An apparatus for sensing user input to an electronic device is described. The apparatus utilizes multiple strain gauge (SG) sensing units which are each disposed adjacent an inner surface of a housing of the electronic device. The apparatus includes an electronic circuit that electrically couples to each SG sensing unit. The electronic circuit is generally configured to receive parameter signals in response to user input that interacts with the housing.

User input to the device can include strain applied to an area of the outer surface of the housing. The area can be either adjacent to, or substantially adjacent to, a particular SG sensing unit that is affixed to an inner surface of the housing on the other side of a housing wall that defines the inner and outer surfaces. In response to the applied strain, the SG sensing unit senses a particular type of user input to the device based on at least one of: a magnitude of the applied strain, the relative location and of the applied strain, or a duration of the applied strain.

In general, each SG sensing unit includes multiple individual strain gauges that each have a particular resistance attribute. The SGs can be arranged in a particular configuration to form a single SG sensing unit and each SG sensing unit can receive a voltage signal of a predefined voltage value. One or more output voltage signals received from each SG sensing unit are then measured by the electronic circuit and then converted into an example parameter signal. The output voltage signals are measured to detect any shifts or changes to the corresponding voltage value of the applied signal.

Applied strain to the outer surface of the housing can cause slight physical changes (e.g., expansion or contraction) to at least one SG of a SG sensing unit. The physical changes can cause a change in a resistance attribute of a SG. The change in the resistance attribute causes a corresponding change in the measured output voltage value and, thus, indicates a differential voltage signal that is received and measured by the electronic circuit. A range of differential output voltage signal values can be mapped to individual user input types. The mapped values can be used by the electronic device to detect or determine particular user input types based on a characteristic of the applied strain and the corresponding signal value caused by the applied strain.

Figure 1:
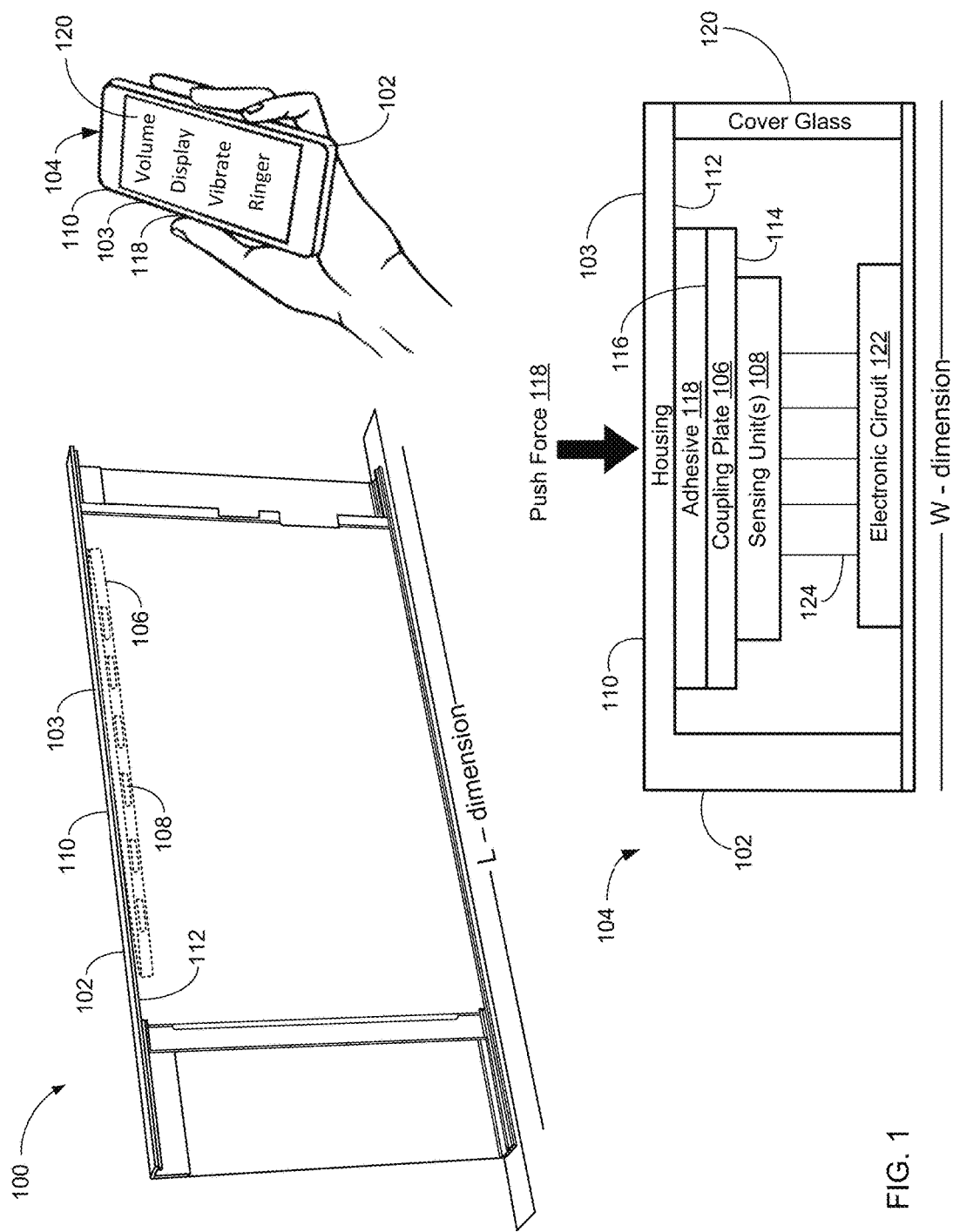
FIG. 1 illustrates diagrams associated with an apparatus for sensing user input to an example electronic device.

FIG. 1 depicts diagrams associated with an apparatus 100 for sensing user input to an example electronic device. Apparatus 100 generally includes a housing 102 that can later receive multiple electronic components to form user device 104. In general, user device 104 can include smartphones, mobile devices, cellular devices, smart televisions, laptop computers, tablet computers, notebook computers, desktop computers, electronic readers, Google Chromecast devices, Google home or a variety other types of computing devices or consumer electronic devices.

Apparatus 100 further includes coupling plate 106 and multiple (SG) sensing units 108 (hereinafter "sensing unit 108"). As discussed in more detail below, each sensing unit 108 can include multiple strain gauges that can form sets of strain gauges that are arranged in a particular configuration within the unit. As generally shown, housing 102 can include a housing wall having an outer surface 110 corresponding to a first side of the wall and an inner surface 112 corresponding to a second side of the wall that is opposite the first side. Similarly, plate 106 can have a first side 114 and a second side 116 that is opposite the first side 114.

In some implementations, plate 106 can include multiple sensing units 108 affixed to first side 114. As shown, plate 106 can be affixed or bonded to inner surface 112 by adhesive 118 that can be disposed generally intermediate second side 116 and housing wall 103. Plate 106 can be formed from a variety of different materials such as steel, fiberglass, hardened plastic or other materials having properties that enable plate 106 to be affixed to wall 103. Adhesive 118 can be any adhesive material or compound such as glue, epoxy resin, bonding agent, or other materials suitable to securely affix/attach plate 106 to inner surface 112 of housing wall 103. Additionally, although identified as an adhesive, a variety of mechanical based fastening means suitable to securely affix/attach or couple plate 106 to inner surface 112 can also be utilized.

Housing 102 can receive multiple electronic components to form user device 104, which includes cover glass 120. Hence, apparatus 100 can include an example electronic circuit 122 that is disposed internally within device 104. Wire(s)/conductor(s) 124 can electrically couple, to circuit 122, one or more strain gauge sets within sensing unit 108.

As discussed in more detail below, an example user can provide a particular type of user input to device 104 by applying a push force 118 that can vary in push force magnitude and push force duration and/or frequency. Push force 118 provides a corresponding strain force that is applied to a particular SG set in respective sensing units 108 affixed to inner surface 112 of housing wall 103. In general, sensing units 108 can be arranged in particular configurations to sense/detect applied strain along, for example, a lengthwise (L) dimension of device 104 and/or a widthwise (W) dimension of device 104.

The applied strain can be detected by a parameter signal received by one or more components of circuit 122. A value of the detected parameter signal can correspond to a particular type of user input. In some implementations, the type of user input can be viewable via a display device through cover glass 120. Different input types can include, for example, user input to adjust an audio volume output of user device 104, user input to activate or deactivate a display device of user device 104, user input to activate or deactivate a vibrate mode of user device 104, and/or user input to adjust the volume of a ring tone of user device 104. In alternative implementations, a variety of different user input types can be detected based, at least in part, on a particular value of the detected parameter signal.

As an example, apparatus 100 can be used in the following implementation. A user, Frank, wants to change the volume on a computing device, e.g., Frank's smartphone. Apparatus 100 can be implemented within Frank's smartphone such that sensing units 108 are disposed along, for example, a lengthwise edge of Frank's smartphone. When Frank presses a part of the smartphone housing associated with a volume setting a particular strain gauge within sensing unit 108 is strained.

In response to the press applied by Frank, a change in a differential voltage value is detected by an electronic circuit disposed within Frank's smartphone. The smartphone can be configured to detect the differential voltage value and associate particular values with, for example, a volume press because the detected voltage change exceeds a threshold voltage change. A duration of the voltage change is measured, and the electronic circuit (which can be part of a microprocessor) outputs a value which indicates to the microprocessor that it is to change the volume of an audio signal that is being output by a speaker of Frank's smartphone.

Figure 2:
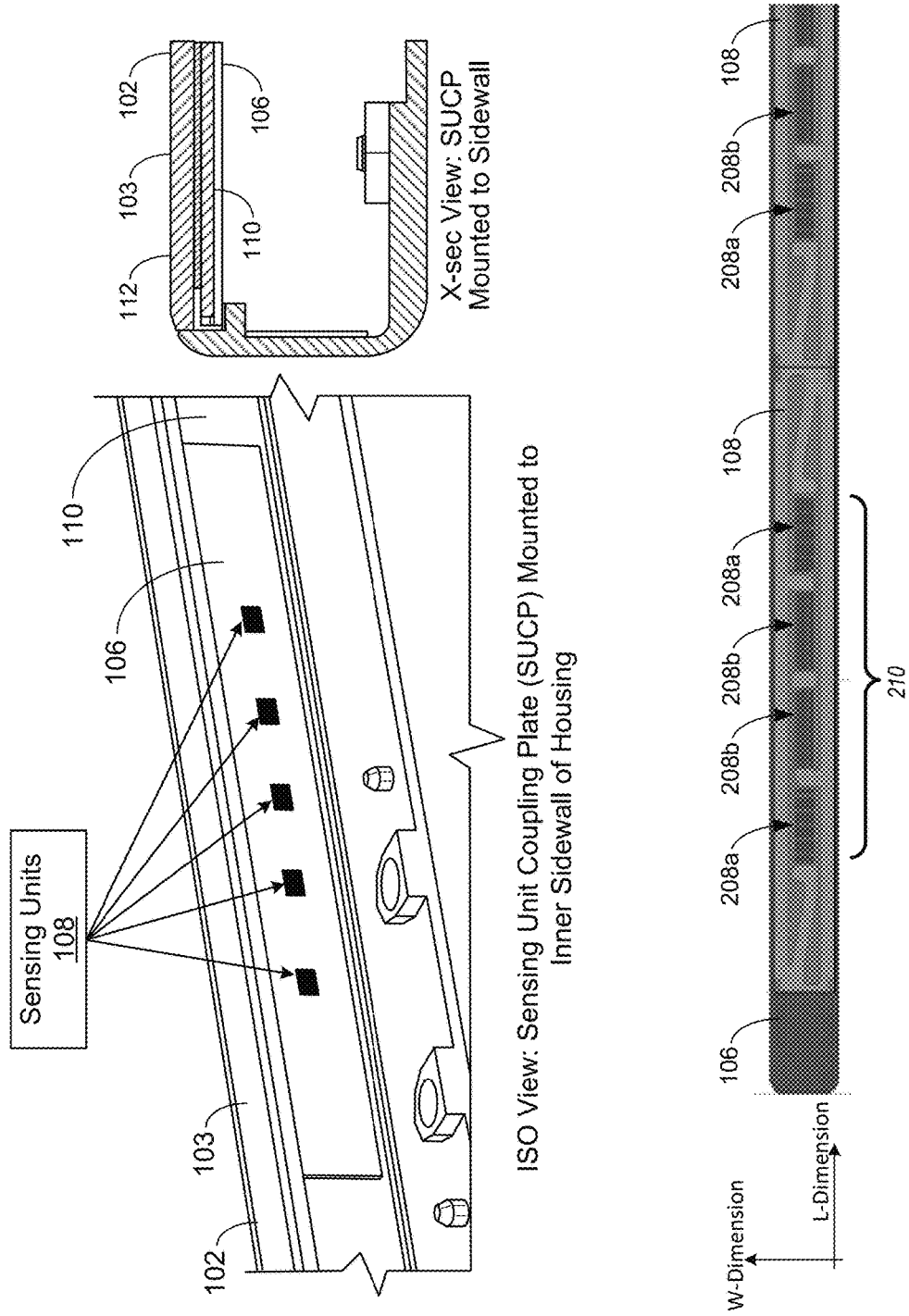
FIG. 2 illustrates diagrams that include multiple strain gauges that can be used in the apparatus of FIG. 1.

FIG. 2 illustrates diagrams that include multiple strain gauge units that can be used in sensing units 108 of apparatus 100. As shown, the implementation of FIG. 2 includes multiple technical features described above with reference to FIG. 1. In particular, FIG. 2 illustrates, in part: 1) an isolation (ISO) view that generally depicts multiple individual sensing units 108 attached to plate 106 that is affixed to inner surface 110 of housing wall 103; and 2) a cross-section (X-sec) view that depicts plate 106 attached/affixed to inner surface 110 of housing wall 103.

Each sensing unit 108 can include multiple strain gauge units 208 that form sets of strain gauges that are arranged in a particular configuration within sensing unit 108. In some implementations, at least two SGs 208 can form a SG set 208a/b and multiple SG sets 208a/b can form a SG grouping 210. When disposed against, or affixed to, inner surface 110, multiple SG sets 208a/b can be arranged in particular orientations relative to each other. For example, a first SG set 208a can be arranged in a first orientation corresponding to a first dimension so as to detect or measure applied strain along the first dimension. Likewise, a second SG set 208b can be arranged in a second orientation corresponding to a second dimension so as to detect or measure applied strain along the second dimension.

In general, the first orientation and the first dimension can be different from the second orientation and the second dimension. In some implementations, when user device 104 is positioned generally longitudinally upright (e.g., when held by a user), the first orientation can correspond to a vertical orientation and the first dimension can correspond to a lengthwise (L) dimension. Further, when in this longitudinally upright position, the second orientation can correspond to a horizontal orientation and the second dimension can correspond to a widthwise (W) dimension.

In the implementation of FIG. 2, when disposed within user device 104, SG grouping 210 can have a SG set 208a that includes two SGs 208 disposed in a horizontal orientation (when the device is upright) to measure applied strain to surface 112 in the widthwise dimension. Moreover, SG grouping 210 can also have a SG set 208b that includes two SG units 208 disposed in a vertical orientation (when the device is upright) to measure applied strain in the lengthwise dimension. As shown, SGs 208 of SG grouping 210 can each be arranged in a parallel configuration, relative to each other, and can be disposed generally along the lengthwise dimension of a wall 103 (e.g., a sidewall) of housing 102.

When installed within user device 104, each SG grouping 210 of sensing unit 108 can be used to detect or sense user input in the form of applied force to surface 112. The applied force can cause SGs 208 to change in electrical characteristics, to cause the electronic circuit 122 to sense an increased strain. User device 104 can be configured to recognize the increased strain as corresponding to different user input types such as a user pushing, swiping, tapping, squeezing or otherwise touching a particular area on a sidewall wall of user device 104.

For example, when a user pushes on an edge or sidewall of housing 102 that is adjacent a SG 208, the housing and plate 106 can bend or flex, causing SG 208 to change in electrical characteristics (e.g., the resistance of resistors change within a particular strain gauge), which affects the voltage of an electrical signal applied to the SG 208 and which causes the electronic circuit 122 (analyzing the electrical signal) to sense an increased strain along, for example, the lengthwise dimension of device 104. Accordingly, user device 104 senses a push on the edge of housing 102 and can indicate to the user, via an example display device (protected by cover glass 120), the particular input type associated with the user's push/touch. In some implementations, multiple sensing units 108 can be disposed or positioned along an edge or sidewall of housing 102 in order to sense or detect the particular input type and/or the proximate location of the push applied along the length of device 104. The electronic circuit 122 can analyze the electrical signal that is received from each of the SG set 208a and SG set 208b.

As an overview of the terminology used herein, user device 104 may include multiple sensors or sensing units 108. Each sensing unit 108 may include two strain gauge sets indicated as features 208a and 208b. As an example, strain gauge set 208a can be oriented vertically and strain gauge set 208b can be oriented horizontally. Each strain gauge set 208a or 208b includes two individual strain gauge units 208. More particularly, and stated another way, each sensing unit 108 includes four strain gauge units 208 or resistors 208 (discussed below with reference to FIG. 3) which form the two strain gauge sets 208a/b or circuit branches (discussed below with reference to FIG. 3). Reference feature 210 refers to a strain gauge grouping that includes the four individual strain gauges 208 that collectively form a single sensor 108.

Figure 3:
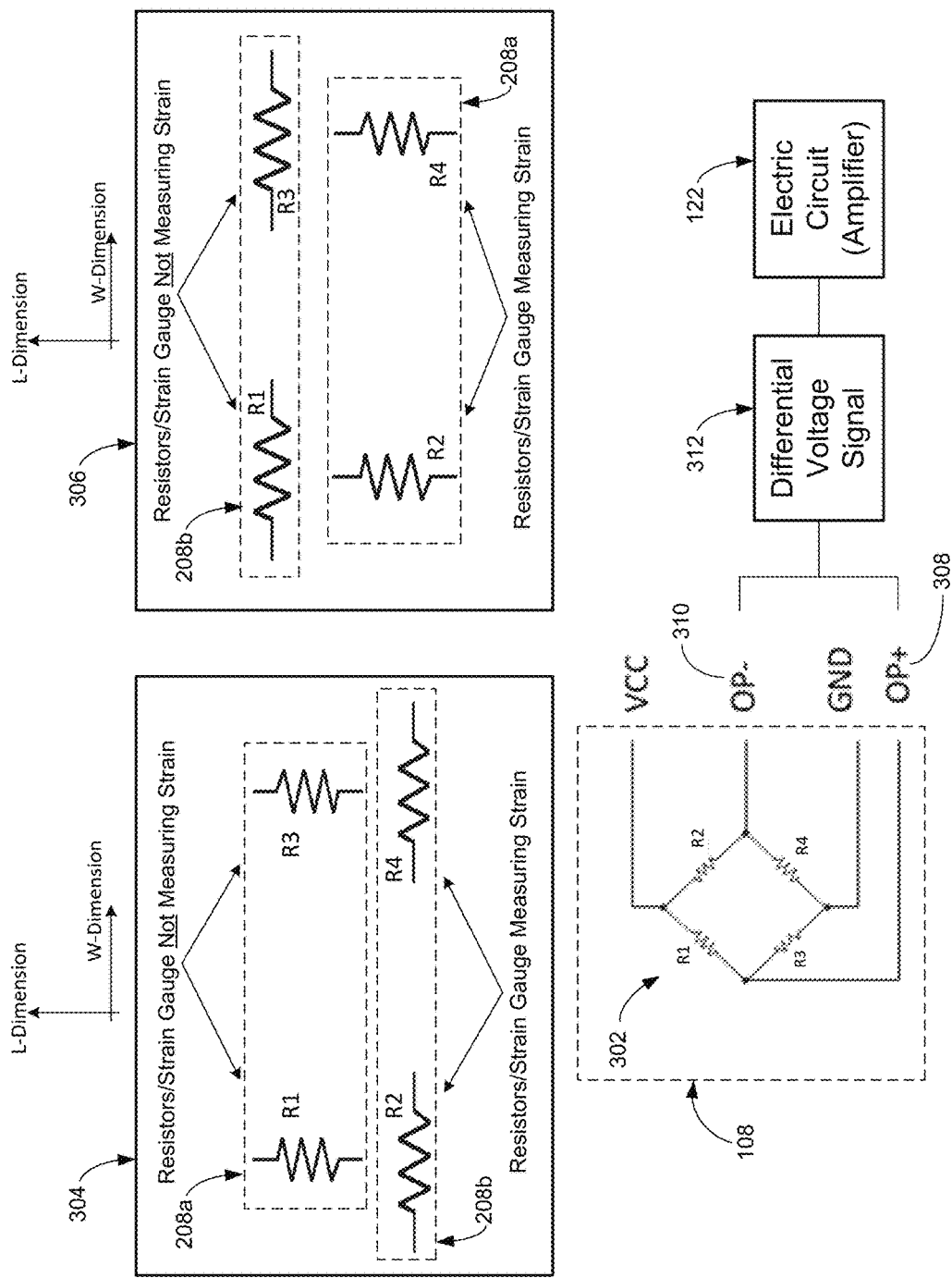
FIG. 3 illustrates diagrams that include resistor configurations and an example bridge circuit that can be implemented to sense user input to an electronic device.

FIG. 3 illustrates diagrams that include resistor configurations and an example bridge circuit 302 that can be used to sense user input to an electronic device. As discussed above, each sensing unit 108 includes multiple individual SGs 208 that each have a particular resistance attribute. Hence, as shown in FIG. 3, in alternative implementations SG 208 can be depicted as one of resistors (R1-R4) that each have a predefined resistance value or resistance attribute. In particular, sensing unit 108 can be modeled or depicted as bridge circuit 302 that includes positive (voltage polarity) output 308 and negative (voltage polarity) output 310.

As shown, in some implementations, resistor orientation 304 can include resistors R2 and R4 having a horizontal orientation so as to measure applied strain in the widthwise (W) dimension, while resistors R1 & R3 (vertical orientation) remain relatively fixed when strain is applied due to their orientation and, thus, do not measure applied strain. In contrast, resistor orientation 306 can include resistors R2 and R4 having a vertical orientation so as to measure applied strain in the lengthwise (L) dimension while resistors R1 & R3 (horizontal orientation) remain relatively fixed when strain is applied due to their orientation and, thus, do not measure applied strain.

In general, when a particular set of resistors are disposed perpendicular to a particular strain direction, that particular resistor set will generally not measure strain associated with that particular strain direction. For example, as shown in resistor orientation 304, for a strain force applied in the widthwise (W) dimension/direction, SG set 208a is perpendicular to the strain direction and, thus, will generally not measure applied strain. However, SG set 208b is parallel to the strain direction and will measure applied strain. Further, as shown in resistor orientation 306, for a strain force applied in the lengthwise (L) dimension/direction, SG set 208b is perpendicular to the strain direction and, thus, will generally not measure applied strain. However, SG set 208a is parallel to the strain direction and will measure applied strain.

In general, bridge circuit 302 includes two branches. A first branch is indicated by R1 & R3 and the output node (for output 308) intermediate R1 & R3. A second branch is indicated by R2 & R4 and the output node (for output 310) intermediate R2 & R4. Bridge circuit 302 can receive an applied voltage (VCC). Electronic circuit 122 can receive or detect a differential voltage signal 312 in response to a change in the resistance attribute of any one of resistors R1-R4. In some implementations, circuit 122 provides the VCC voltage signal and can then execute a basic comparator circuit to analyze signal 312 relative to the VCC signal. The analysis can enable circuit 122 to detect or determine the extent to which the measured value of signal 312 indicates a deviation from the initially applied VCC voltage value.

During operation, and when disposed along inner surface 110 within user device 104, sensing unit 108 can detect applied strain in response to a touch force that is applied to a certain location of housing wall 103 (e.g., an edge/sidewall of user device 104). For example, and as noted above, user input in the form of applied strain to the edge of device 104 can cause parameter signals to be received by electronic circuit 122. The parameter signals can be received in response to user input detected by sensing unit 108, e.g., SG grouping 210, and can indicate a user input of a particular type, e.g., volume adjustment, activate vibrate mode, etc. Hence, detection of the user input can cause a corresponding response from device 104, e.g., indication on the display device associated with a volume level increasing or decreasing.

For example, and with reference to bridge circuit 302, sensing unit 108 can include SG set 208a (resistors R1 & R3) that indicates a parameter signal having a first voltage value (via output node 308). Sensing unit 108 can further include SG set 208b (resistors R2 & R4) that indicates a parameter signal having a second voltage value (via output node 310). The first voltage value and the second voltage value can be indicated concurrently in response to the user input of a particular type that causes a particular corresponding response from user device 104.

In some examples, applied strain in the W-dimension can cause physical changes to SG set 208b that in turn causes the resistance attribute of resistors R2 & R4, measured in ohms, to change (either increase or decrease) by a predefined amount based on the magnitude of the applied force. Accordingly, presuming all resistance values in circuit 302 are generally the same, the change in a resistance attribute of R2 & R4 will cause a corresponding change in the voltage value measured at output 310. Thus, a differential voltage signal 312, relative to outputs 308 and 310, will be measured or detected by electronic circuit 122. In some implementations, measured parameter signals can be, for example, in the microvolt or the millivolt range. Thus, measured signals can be amplified by an example amplification circuit associated with electronic circuit 122.

Figure 4:
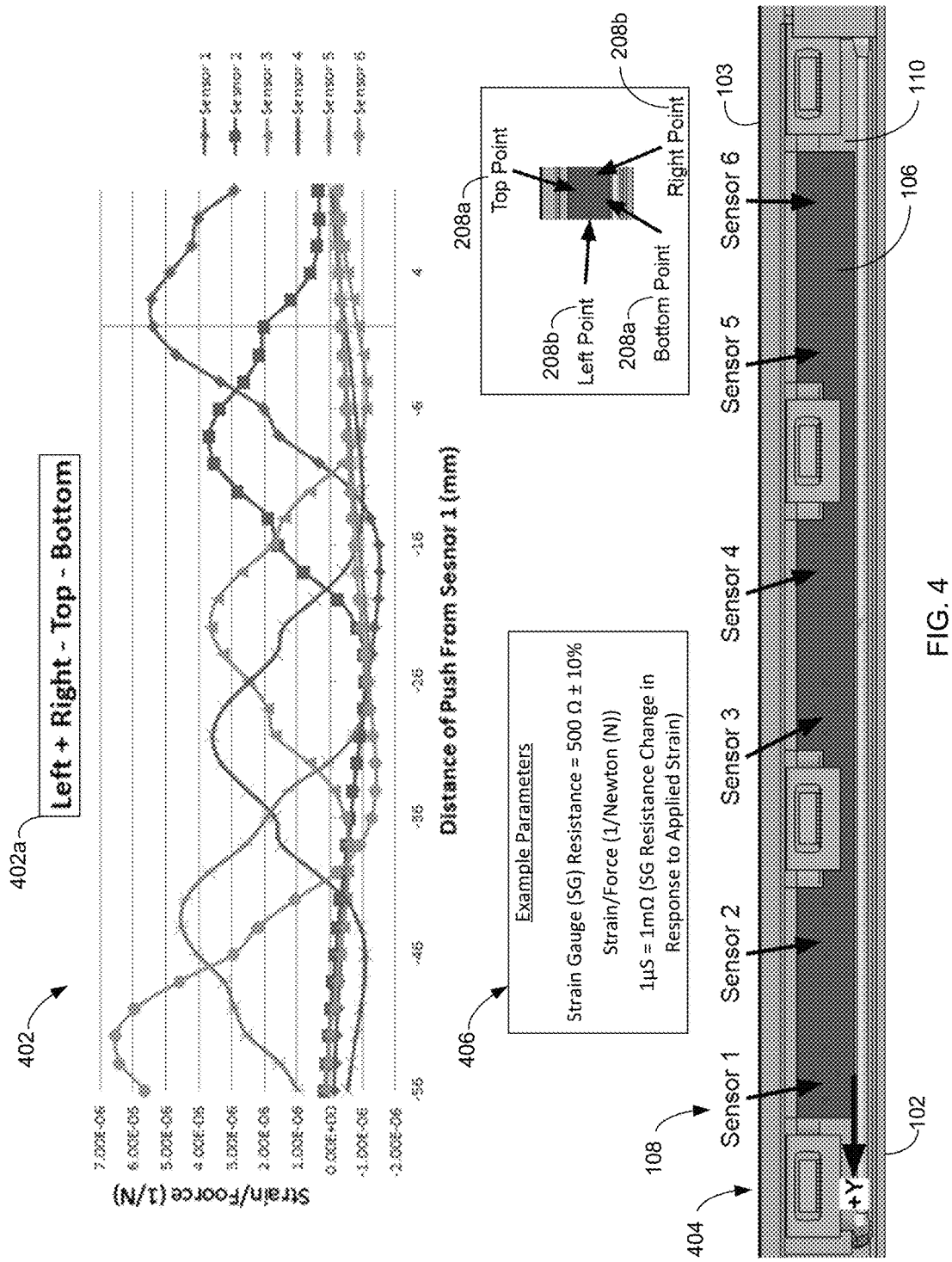
FIG. 4 illustrates a diagram of multiple strain gauge sensors and corresponding graphical data associated with individual sensor measurements.

FIG. 4 illustrates a diagram 404 of multiple strain gauges 208 arranged in a diamond configuration to form multiple sensing units 108 as well as corresponding graphical data 402 associated with individual sensor measurements that indicate a particular strain force for respective sensors. The implementation of FIG. 4 further illustrates example data parameters 406 associated with the technical features of apparatus 100. As shown, each sensing unit/sensor 108 can have a SG set 208a that includes a SG 208 in the top point position and a SG 208 in the bottom point position. Likewise, each sensor 108 can also have a SG set 208b that includes a SG 208 in the left point position and a SG 208 in the right point position. The diamond configuration of the SGs 208 depicted in the embodiment of FIG. 4 differs slightly from the parallel configuration of the SGs 208 depicted in the embodiment of FIG. 2.

In general, a diamond configuration can be used to form a sensing unit 108 that is more compact (relative to the parallel configuration) along a length of device 104. Use of the diamond configuration can provide increased precision relative to the location of push and potentially higher signal 312 for the same applied load. Alternatively, in some implementations, the parallel configuration, discussed above, can use a smaller width such that sensing units that include strain gauges arranged in the parallel configuration can be utilized on thinner electronic devices. Moreover, the parallel configuration can provide a simplified installation process when being placed within electronic devices that have limited space.

In general, a variety of different strain gauges orientations can be used for apparatus 100 depending on a device manufacturer's desired level of precision, the manufacturer's desired accuracy regarding the ability to detect the particular location of an electronic device that a user is pushing, and the available space within the electronic device that apparatus 100 will be installed.

As noted above, applied strain/force to an edge/sidewall surface associated with housing wall 103 can cause slight physical changes (e.g., expansion or contraction) to at least one SG 208 of sensor(s) 108. The physical changes can cause a change in a resistance attribute of SG 208. The change in the resistance attribute can cause a corresponding change in the measured output voltage value, thereby causing differential voltage signal 312. In some implementations, equation 402a indicates that, for the strain gauge diamond orientation of FIG. 4, total top & bottom voltage values can be subtracted from total left & right voltage values to obtain a differential voltage value. For example, differential voltage signal 312 can correspond to adding the measured voltage values associated with SG set 208b (positive polarity) and subtracting the measured voltage values associated with SG set 208a (negative polarity) to obtain a differential voltage value that can be mapped to a particular strain force.

In some implementations, a particular strain force can be mapped to a particular voltage value associated with differential voltage signal 312. The applied strain force can be measured in strain units and a particular strain value can correspond to a particular resistance attribute change for each individual SG 208. For example, a magnitude of applied force provided as user input to device 104 can be indicated as one micro-strain (µS). Hence, 1 µS can correspond to a 1 mΩ change in the resistance value/attribute associated with a single SG 208 (e.g., resistor R2 of FIG. 3). In particular, for an example resistance value of 500Ω±10%, an applied strain of 6.5 µS (see sensor 6 of graph 402) can result in a modified resistance value of 506.5Ω±10%. In some implementations, a range of differential output voltage signal values can be mapped to individual user input types. The mapped values can be used by user device 104 to determine particular user input types based on the duration and/or magnitude (in units of strain-force) of the applied strain.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus.

Alternatively or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit). Various implementations of the systems and techniques described here can be realized in digital electronic circuitry, integrated circuitry, specially designed ASICs, computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

To provide for interaction with a user, the systems and techniques described here can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

A number of embodiments have been described. Nevertheless, it will be understood that various modifications may be made without departing from the spirit and scope of the invention. For example, various forms of the flows shown above may be used, with steps re-ordered, added, or removed. Also, although several applications of the payment systems and methods have been described, it should be recognized that numerous other applications are contemplated. Accordingly, other embodiments are within the scope of the following claims.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An apparatus for sensing user input provided on an exterior surface of an electronic device, comprising:
    a first strain gauge grouping attached to an inner surface of a sidewall of a housing of the electronic device, the first strain gauge grouping forming a first resistor bridge that includes:
        (a) a first strain gauge set of multiple strain gauges that includes a first strain gauge affixed in a first orientation, and
        (b) a second strain gauge set of multiple strain gauges that includes a second strain gauge affixed in a second orientation that differs from the first orientation;
    a second strain gauge grouping attached to the inner surface of the sidewall of the housing of the electronic device, the second strain gauge grouping forming a second resistor bridge that includes:
        (c) a third strain gauge set of multiple strain gauges that includes a third strain gauge affixed in the first orientation, and
        (d) a fourth strain gauge set of multiple strain gauges that includes a fourth strain gauge affixed in the second orientation that differs from the first orientation; and
    an electronic circuit electrically coupled to the first strain gauge grouping and the second strain gauge grouping, the electronic circuit configured to:
        (i) receive a first parameter signal from the first strain gauge grouping associated with changes in a resistance attribute of the first strain gauge grouping in response to user input that interacts with the housing over a location of the first strain gauge grouping, and
        (ii) receive a second parameter signal from the second strain gauge grouping associated with changes in a resistance attribute of the second strain gauge grouping in response to user input that interacts with the housing over a location of the second strain gauge grouping.

2. The apparatus of claim 1, wherein:
    the first strain gauge set of multiple strain gauges indicates a first voltage value when voltage is applied to the first strain gauge set of multiple strain gauges;
    the second strain gauge set of multiple strain gauges that indicates a second voltage value when voltage is applied to the second strain gauge set of multiple strain gauges; and
    wherein the first voltage value and the second voltage value are indicated concurrently in response to the user input that interacts with the housing over the location of the first strain gauge grouping.

3. The apparatus of claim 2, wherein the electronic circuit determines a differential voltage value that corresponds to a difference between the first voltage value of the first strain gauge set and the second voltage value of the second strain gauge set.

4. The apparatus of claim 3, wherein:
    the third strain gauge set of multiple strain gauges indicates a third voltage value when voltage is applied to the third strain gauge set of multiple strain gauges;
    the fourth strain gauge set of multiple strain gauges indicates a fourth voltage value when voltage is applied to the fourth strain gauge set of multiple strain gauges; and
    wherein the third voltage value and the fourth voltage value are indicated concurrently in response to the user input that interacts with the housing over the location of the second strain gauge grouping.

5. The apparatus of claim 4, wherein the electronic circuit determines a second differential voltage value that corresponds to a difference between the third voltage value of the third strain gauge set and the fourth voltage value of the fourth strain gauge set.

6. The apparatus of claim 1, further including a third strain gauge grouping, wherein the first strain gauge grouping, the second strain gauge grouping, and the third strain gauge grouping are attached longitudinally along the inner surface of the sidewall of the housing by way of an adhesive material.

7. The apparatus of claim 6, wherein the first strain gauge grouping is configured to allow the electronic device to sense user input to the electronic device, the sensed user input being of a plurality of different types that the electronic circuit is configured to detect.

8. The apparatus of claim 7, wherein the first strain gauge grouping interacts with the second strain gauge grouping to allow the electronic device to sense user input corresponding to at least one of:
    a particular magnitude of physical force applied to an outer surface of the housing;
    a particular time period associated with physical force applied to the outer surface of the housing; and a particular magnitude of physical force applied to the outer surface of the housing for a particular time period.

9. The apparatus of claim 1, wherein in response to user input detected using the first strain gauge grouping, the electronic circuit amplifies a characteristic of the first parameter signal indicated by the first resistor bridge.

10. The apparatus of claim 1, wherein the first orientation and the second orientation are perpendicular to each other.

11. The apparatus of claim 1, wherein the first parameter signal indicates a differential voltage value, and wherein the resistance attribute of the first strain gauge grouping changes in response to tension applied concurrently to each of the first strain gauge of the first resistor bridge and the second strain gauge of the first resistor bridge.

12. The apparatus of claim 1, wherein:
each of the multiple strain gauges of the first strain gauge set are affixed in the first orientation;
each of the multiple strain gauges of the second strain gauge set are affixed in the second orientation;
each of the multiple strain gauges of the third strain gauge set are affixed in the first orientation;
each of the multiple strain gauges of the fourth strain gauge set are affixed in the second orientation; and
the first orientation is perpendicular to the second orientation.

13. The apparatus of claim 12, wherein:
the multiple strain gauges of the first strain gauge set and the multiple strain gauges of the second strain gauge set are both affixed to a first coupling plate that is affixed to the inner surface of the sidewall of the housing;
the multiple strain gauges of the third strain gauge set and the multiple strain gauges of the fourth strain gauge set are both affixed to a second coupling plate that is affixed to the inner surface of the sidewall of the housing; and
the inner surface of the sidewall of the housing is perpendicular to a front surface of the electronic device which is at least partially defined by cover glass for a display.

14. The apparatus of claim 12, wherein:
the multiple strain gauges of the first strain gauge set are parallel and adjacent to each other;
the multiple strain gauges of the second strain gauge set are parallel and adjacent to each other;
the multiple strain gauges of the first stain gauge set are spaced apart from the multiple strain gauges of the second strain gauge set;
the multiple strain gauges of the third strain gauge set are parallel and adjacent to each other;
the multiple strain gauges of the fourth strain gauge set are parallel and adjacent to each other; and
the multiple strain gauges of the third stain gauge set are spaced apart from the multiple strain gauges of the fourth strain gauge set.

15. An apparatus for sensing user input provided on an area of a device, comprising:
a first strain gauge grouping attached to a sidewall of a housing of the device, the first strain gauge grouping forming a first resistor bridge that includes:
(a) a first strain gauge set of multiple strain gauges that are each affixed in a first orientation, and
(b) a second strain gauge set of multiple strain gauges that are each affixed in a second orientation that differs from the first orientation;
a second strain gauge grouping attached to a sidewall of the housing of the device, the second strain gauge grouping forming a second resistor bridge that includes:
(c) a third strain gauge set of multiple strain gauges that are each affixed in the first orientation, and
(d) a fourth strain gauge set of multiple strain gauges that are each affixed in the second orientation that differs from the first orientation; and
a processor that is electrically coupled to the first strain gauge grouping and the second strain gauge grouping to:
(i) receive a first signal from the first strain gauge grouping associated with changes in a resistance attribute of the first strain gauge grouping in response to user input that interacts with the housing over a location of the first strain gauge grouping, and
(ii) receive a second signal from the second strain gauge grouping associated with changes in a resistance attribute of the second strain gauge grouping in response to user input that interacts with the housing over a location of the second strain gauge grouping.

16. The apparatus of claim 15, wherein the first strain gauge grouping interacts with at least the second strain gauge grouping to allow the device to sense user input corresponding to at least one of:
a particular magnitude of physical force applied to the housing;
a particular time period associated with physical force applied to the housing; and
a particular magnitude of physical force that is applied to the housing for a particular time period.

17. The apparatus of claim 15, wherein:
the first strain gauge set is configured to indicate a first voltage value;
the second strain gauge set configured to indicate a second voltage value; and
the first voltage value and the second voltage value are indicated concurrently in response to user input interacting with the housing of the device.

18. The apparatus of claim 15, wherein:
the first strain gauge grouping is attached to a surface of a first plate and the first plate is attached to the housing;
the second strain gauge grouping is attached to a surface of a second plate and the second plate is attached to the housing; and
the first plate and the second plate are arranged in a parallel configuration.

19. The apparatus of claim 18, wherein:
the first plate is attached to the housing by way of an adhesive material; and
the second plate is attached to the housing by way of an adhesive material.

20. The apparatus of claim 15, wherein:
the multiple strain gauges of the first strain gauge set are parallel and adjacent to each other;
the multiple strain gauges of the second strain gauge set are parallel and adjacent to each other;
the multiple strain gauges of the first stain gauge set are spaced apart from the multiple strain gauges of the second strain gauge set;
the multiple strain gauges of the third strain gauge set are parallel and adjacent to each other;
the multiple strain gauges of the fourth strain gauge set are parallel and adjacent to each other; and the multiple strain gauges of the third stain gauge set are spaced apart from the multiple strain gauges of the fourth strain gauge set.

\* \* \* \* \*